United States Patent
Bolcavage et al.

(10) Patent No.: US 6,579,431 B1
(45) Date of Patent: Jun. 17, 2003

(54) DIFFUSION BONDING OF HIGH PURITY METALS AND METAL ALLOYS TO ALUMINUM BACKING PLATES USING NICKEL OR NICKEL ALLOY INTERLAYERS

(75) Inventors: Ann Bolcavage, Plainfield, IN (US); Jeff Hart, Columbus, OH (US)

(73) Assignee: Tosoh SMD, Inc., Grove City, OH (US)

( * ) Notice: Subject to any disclaimer, the term of this patent is extended or adjusted under 35 U.S.C. 154(b) by 0 days.

(21) Appl. No.: 09/226,798

(22) Filed: Jan. 7, 1999

Related U.S. Application Data

(60) Provisional application No. 60/099,926, filed on Sep. 11, 1998, and provisional application No. 60/071,316, filed on Jan. 14, 1998.

(51) Int. Cl.⁷ .......................... C23C 14/34; B23K 20/00
(52) U.S. Cl. ............................. 204/298.13; 204/298.12; 428/652; 428/650; 228/115; 228/116; 228/164; 228/165; 228/174; 228/203; 228/194
(58) Field of Search ................... 204/298.12, 298.13; 428/652, 650; 228/115, 116, 164, 165, 174, 203, 194

(56) References Cited

U.S. PATENT DOCUMENTS

| | | | |
|---|---|---|---|
| 3,482,305 A | 12/1969 | Dockus et al. | |
| 4,194,672 A | 3/1980 | Uto et al. | 228/194 |
| 4,209,375 A | 6/1980 | Gates et al. | |
| 4,341,816 A | 7/1982 | Lauterbach et al. | |
| 4,476,151 A | 10/1984 | Keller et al. | |
| 4,706,145 A * | 11/1987 | Hirabayashi et al. | 360/118 |
| 4,889,584 A * | 12/1989 | Wada et al. | 216/17 |
| 4,890,784 A | 1/1990 | Bampton | 228/194 |
| 5,066,381 A | 11/1991 | Ohta et al. | 204/298.12 |
| 5,143,590 A | 9/1992 | Strothers et al. | 204/298.12 |
| 5,230,459 A * | 7/1993 | Mueller et al. | 228/164 |
| 5,234,487 A | 8/1993 | Wickersham, Jr. et al. | 75/248 |
| 5,244,556 A | 9/1993 | Inoue | 204/192.12 |
| 5,322,740 A | 6/1994 | Ghosh | 428/649 |
| 5,338,425 A | 8/1994 | Mishima et al. | 204/298.12 |
| 5,354,446 A | 10/1994 | Kida et al. | 204/298.22 |
| 5,428,882 A | 7/1995 | Makowiecki et al. | 29/527.5 |
| 5,504,992 A * | 4/1996 | Fukutomi et al. | 29/847 |
| 5,593,082 A | 1/1997 | Ivanov et al. | 228/122.1 |
| 5,642,853 A | 7/1997 | Lee | 228/127 |
| 5,653,856 A | 8/1997 | Ivanov et al. | 204/192.12 |
| 5,803,342 A | 9/1998 | Kardokus | 228/173.2 |
| 2002/0003010 A1 * | 1/2002 | Shah et al. | 148/518 |

FOREIGN PATENT DOCUMENTS

| | | | |
|---|---|---|---|
| EP | 590904 | * | 4/1994 |
| WO | WO/9319220 | | 9/1993 |
| WO | WO/9826107 | | 6/1998 |
| WO | WO/9841669 | | 9/1998 |
| WO | WO 98/41669 | * | 9/1998 |

\* cited by examiner

*Primary Examiner*—Alan Diamond
(74) *Attorney, Agent, or Firm*—Wegman, Hessler & Vanderburg

(57) ABSTRACT

An improved method for joining mating surfaces of a metallic sputter target and a backing plate of aluminum, aluminum alloy or aluminum matrix composite material to form a sputter target/backing plate assembly comprises the steps of roughening the mating surface of either the sputter target or the backing plate to form a plurality of salient portions; depositing an intermediate layer comprising nickel on that mating surface; pressing the sputter target and the backing plate together along the mating surfaces so as to disrupt the mating surfaces; and holding the sputter target and the backing plate in contact at a temperature just below the melting points of the sputter target and backing plate materials to promote diffusion bonding. In an especially preferred form of the invention, the mating surface on the harder of the sputter target or the backing plate is roughened by machining a series of concentric grooves. The grooved mating surface is covered by a layer of nickel having a consistent thickness, preferably by means of electroplating, sputtering, electroless plating, or as a foil. The sputter target and the backing plate are then joined along the mating surfaces using hot isostatic pressing or vacuum hot pressing.

26 Claims, 3 Drawing Sheets

DIFFUSION BONDING OF HIGH PURITY METALS AND METAL ALLOYS TO ALUMINUM BACKING PLATES USING NICKEL OR NICKEL ALLOY INTERLAYERS

CROSS-REFERENCE TO RELATED APPLICATION

The benefit of prior U.S. Provisional Application No. 60/071,316, filed Jan. 14, 1998 is hereby claimed and the benefit of prior U.S. provisional application No. 60/099,926 filed Sep. 11, 1998 is also claimed.

FIELD OF THE INVENTION

The present invention relates to methods for preparing sputter target/backing plate assemblies, and to the target/backing plate assemblies prepared by these methods. More particularly, the invention pertains to methods for diffusion bonding high purity metal or metal alloy sputter targets to associated backing plates composed of aluminum, aluminum alloy or aluminum matrix composite material, using nickel interlayers and to assemblies produced thereby.

BACKGROUND OF THE INVENTION

Cathodic sputtering is widely used for depositing thin layers or films of materials from sputter targets onto desired substrates. Basically, a cathode assembly including the sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits to form the thin layer or film on the receiving surface of the substrate.

In so-called magnetron sputtering, a magnet is positioned behind the cathode assembly to generate an arch-shaped magnetic field. The arch-shaped field, formed in a closed loop configuration over the sputtering surface of the sputter target, serves to trap electrons in annular regions adjacent the sputtering surface. The increased concentrations of electrons in the annular regions adjacent the sputtering surface promote the ionization of the inert gas in those regions and increase the frequency with which the gas ions strike the sputtering surface beneath those regions.

The sputter target is heated during the sputtering process by the thermal energy of the bombarding gas ions. This heat is dissipated by heat exchange with a cooling fluid typically circulated beneath or around a backing plate which is bonded to the sputter target along an interface opposite the sputtering surface.

High purity metal and metal alloy sputter targets historically have been solder bonded to copper alloy backing plates. Yet, as larger and heavier sputtering targets have been used in coating progressively larger substrates, mechanical problems, such as deflection of the sputter target/backing plate assembly during use, and ergonomic problems, such as difficulty in lifting the assembly during manufacture and in installing the assembly for use, have arisen. The relatively high specific gravities of copper and copper alloys have led to efforts to manufacture backing plates from lighter metals such as aluminum, aluminum alloys and aluminum matrix composite materials in order to reduce the weights of sputter target/backing plate assemblies. Where an assembly comprising a copper sputter target and a copper backing plate might weigh approximately 40–50 lbs. (18–23 kg.), an assembly using a copper sputter target and an aluminum or aluminum alloy backing plate of the same sizes may weigh only 25–30 lbs. (11–14 kg.).

Furthermore, the use of larger sputter targets and higher levels of sputtering power has increased the stresses on the bonds joining the sputter targets to the backing plates. To a certain extent, soft solders have accommodated stresses exerted on the sputter target/backing plate assemblies as the assemblies are heated during the sputtering process and subsequently cooled. When weak solder bonds have been used to join materials with widely differing thermal expansion rates, however, the bonds have been susceptible to shear failure initiating at the extreme edges of the bond interfaces. Such shear failures commonly have resulted in debonding of the sputter targets from the backing plates during service. The higher melting temperature solders used for high power applications are stronger but have been less forgiving of the stresses developed in the material systems. As a consequence, the use of solder bonding has imposed practical limits on the sizes of the sputter targets and the levels of sputtering power which sputter target/backing plate assemblies could sustain.

High strength sputter target/backing plate assemblies have been formed by diffusion bonding. A diffusion bond is formed by pressing mating surfaces of the sputter target and the backing plate into intimate contact while heating the sputter target and backing plate materials to a temperature just below their melting points to induce the materials to interdiffuse.

Diffusion bonds generally have required extreme care in preparation and in maintaining surface cleanliness prior to and during the bonding operation to ensure reliable bond qualities. Unless removed, surface oxide layers formed on metals such as aluminum could act as diffusion barriers, increasing the difficulty of forming strong bonds. Typical planar bond interfaces were subject to shearing which commonly led to peeling away at the ends of the bond areas. The formation of brittle intermetallics at the bond interfaces, which increased in thickness with longer periods of heat exposure, added to the potential for bond shear failures.

Mueller et al. U.S. Pat. No. 5,230,459, issued in July of 1993, taught that successful high-strength sputter target/backing plate assemblies could be manufactured by diffusion bonding high purity titanium sputter targets to lightweight aluminum alloy backing plates. Tensile strengths of up to 25 ksi ($1.7 \times 10^8$ N/m$^2$) have been achieved by this method.

Titanium has the intrinsic property of reducing aluminum oxide at elevated temperature, thus preventing the oxide from acting as a diffusion barrier. Furthermore, the addition of microgrooves, machined on a mating surface of the titanium sputter target, acts to puncture the oxide layer as well as to provide additional surface area for diffusion. Aluminum diffuses rapidly into the titanium at the interface, forming a sound metallurgical bond that is sufficiently thick yet not composed of brittle intermetallic phases.

Similar methods have not been successful in forming high-strength metallurgical bonds between sputter targets of other high purity metals and their alloys, such as but not limited to copper, cobalt, palladium and platinum, and backing plates of lightweight aluminum. The respective binary systems between these metals and aluminum exhibit several brittle metallic interphases at low temperatures near the aluminum termini of their phase diagrams. For example, copper and aluminum are capable of forming a low temperature intermetallic phase incapable of withstanding a tensile stress greater than approximately 2 ksi ($1.4 \times 10^7$ N/m²). Thick layers of these brittle interphases tend to form during the diffusion bonding process. This morphology at the interface substantially reduces the mechanical load necessary to initiate failure during tensile testing.

Accordingly, there remains a need in the art for a method for bonding high purity metals and metal alloys to lightweight metallic backing plates so that the bonded joint will be mechanically sound so as to allow for higher levels of sputtering power and larger sputter target designs without risk of deflection or debonding in use at elevated temperatures.

Additionally due to the increasing usage of copper in semiconductor circuitry, there is a need for a light weight copper target/backing plate assembly that can withstand prolonged high power sputter usage periods without significant target/backing plate debonding.

SUMMARY OF THE INVENTION

These and other objects of the invention are met by a method for manufacturing or fabricating sputter target/backing plate assemblies in which high purity metal or metal alloy sputter targets are diffusion bonded to backing plates formed from aluminum, aluminum alloy or aluminum matrix composite material through the medium of a nickel or nickel alloy interlayer. The method is of particular utility in connection with the joining of such backing plates to sputter targets formed from metallic materials such as copper, cobalt, palladium and platinum which tend to form low temperature brittle intermetallic phases when diffusion bonded directly to aluminum or its alloys.

More specifically, the invention contemplates an improved method for joining mating surfaces of a metallic sputter target and a backing plate of aluminum, aluminum alloy or aluminum matrix composite material to form a sputter target/backing plate assembly. The method comprises the steps of roughening the mating surface of either the sputter target or the backing plate to form a plurality of salient portions projecting from one of the surfaces; depositing an intermediate layer comprising nickel on one of the mating surfaces; pressing the sputter target and the backing plate together along the mating surfaces so as to disrupt the mating surfaces; and holding the sputter target and the backing plate in contact at a temperature just below the melting points of the sputter target and backing plate materials to promote diffusion bonding.

In an especially preferred form of the invention, the mating surface on the harder of the sputter target or the backing plate is roughened by machining a series of concentric grooves therein. The grooved mating surface is covered by a layer of nickel having a consistent thickness, preferably by means of plating, sputtering, electroless plating or nickel foil or plasma spraying. The sputter target and the backing plate are then joined along the mating surfaces using hot isostatic pressing or vacuum hot pressing.

The process results in a fully joined assembly wherein the sputter target material, preferably high purity metal or metal alloy, is bonded in situ to the backing plate material, preferably aluminum, aluminum alloy or aluminum matrix composite material, through the medium of the nickel interlayer. Preferably, the nickel interlayer is of sufficient thickness that the sputter target and the backing plate form substantially separate metallurgical bonds with the nickel; that is, the assembly forms two relatively strong intermetallic phases, including a first intermetallic phase between the nickel and the aluminum species of the backing plate and a second intermetallic phase between the nickel and the high purity metal or metal alloy of the sputter target, rather than a single, relatively brittle intermetallic phase between the sputter target and backing plate materials themselves.

Typically, the high purity metal or metal alloy of the sputter target will be harder than the aluminous material of the backing plate. This is true where the target material is copper, cobalt, palladium, platinum or an alloy thereof. When the grooves and the nickel interlayer are formed on a mating surface of a sputter target formed of a metallic material harder than the metallic material from which the backing plate is composed, the jagged salient portions or ridges defined between the grooves serve to puncture the native oxide on the aluminum backing plate. The sides of the grooves provide additional surface area across which the aluminum species from the backing plate diffuse to form a thick, yet strong, nickel-aluminum intermetallic phase.

The disruption of the mating surfaces caused by the pressing of the roughened surface against a substantially planar mating surface is believed to provide additional mechanical advantages. It is believed that the non-planar interface between the sputter target and backing plate portion of the completed assembly increases the resistance of the bond to shear failure. Furthermore, it is believed that the salient portions defined by the grooves fold over during the pressure consolidation of the assembly to form a locking type mechanism.

Whether on the mating surface of the sputter target or of the backing plate, the roughening provides the added advantage of facilitating the deposit of the nickel interlayer through the removal or disruption of any oxide layer formed on that surface.

The interlayer is preferably formed of metallic nickel due to the ability of metallic nickel to form strong intermetallic phases with aluminum. Apart from this, the high electrical conductivity and favorable magnetic properties of nickel minimize interference with the current flows and magnetic fields generated during magnetron sputtering processes. Pass-through flux tests have shown that the magnetic field penetrating the target assembly has substantially the same value as that detected when the same arrangement of magnets is positioned in open air.

Other objects and advantages of the invention will be apparent from the following description, the accompanying drawings and the appended claims.

DETAILED DESCRIPTION OF THE PREFERRED EMBODIMENT

Figure 1:
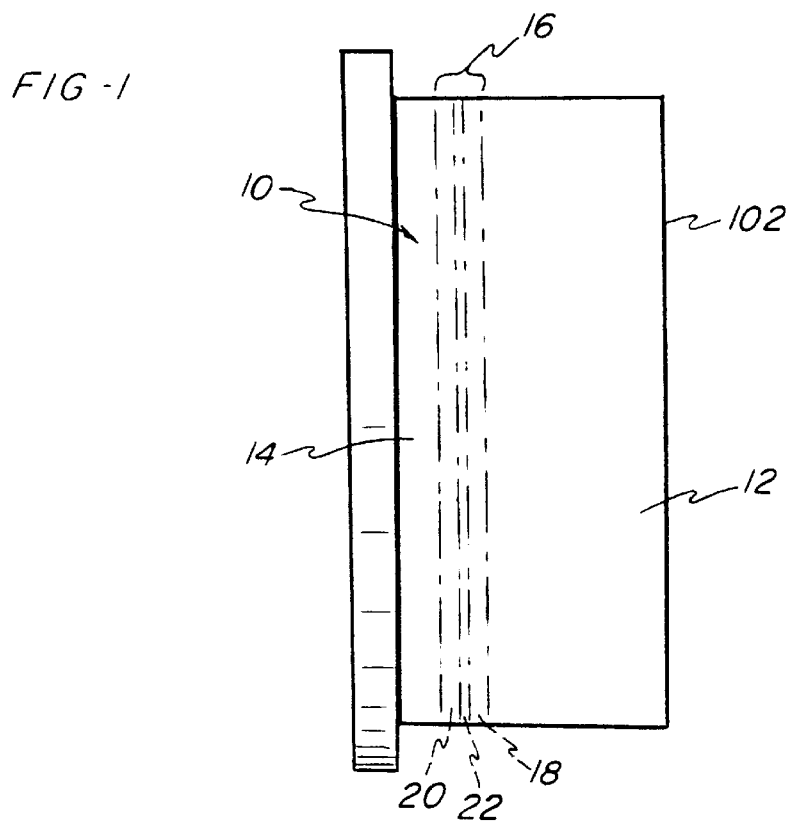
FIG. 1 is a side elevational view of a sputter target/backing plate assembly fabricated according to the present invention.

FIG. 1 is a side view of a preferred sputter target/backing plate assembly 10 made in accordance with the inventive methods herein disclosed. The sputter target/backing plate assembly 10 includes a sputter target portion 12 composed of a high purity metal or metal alloy material and a backing plate section 14 composed of aluminum, aluminum alloy or aluminum matrix composite material. The sputter target portion 12 and the backing plate portion 14 are joined along an interface 16 which includes a first intermediate portion 18. It is thought that the first intermediate portion is composed of an intermetallic phase including nickel and the high purity metal or metal alloy, and a second intermediate portion 20, composed of an intermetallic phase including nickel and aluminum. Depending on the thickness of the interface 16, a portion 22 composed primarily of nickel may lie between the first and second intermediate portions 18, 20. The two intermediate portions 18, 20 each constitute metallurgical bonds which together secure the sputter target portion 12 and the backing plate portion 14 together. As shown, the target comprises a relatively planar surface 102 from which sputtering material is to be ejected from the target to coat the desired substrate during the sputtering process. The skilled artisan will appreciate that although a planar sputtering surface is shown, a method including other surface shapes such as concave or convex surface areas may be used.

Figure 2:
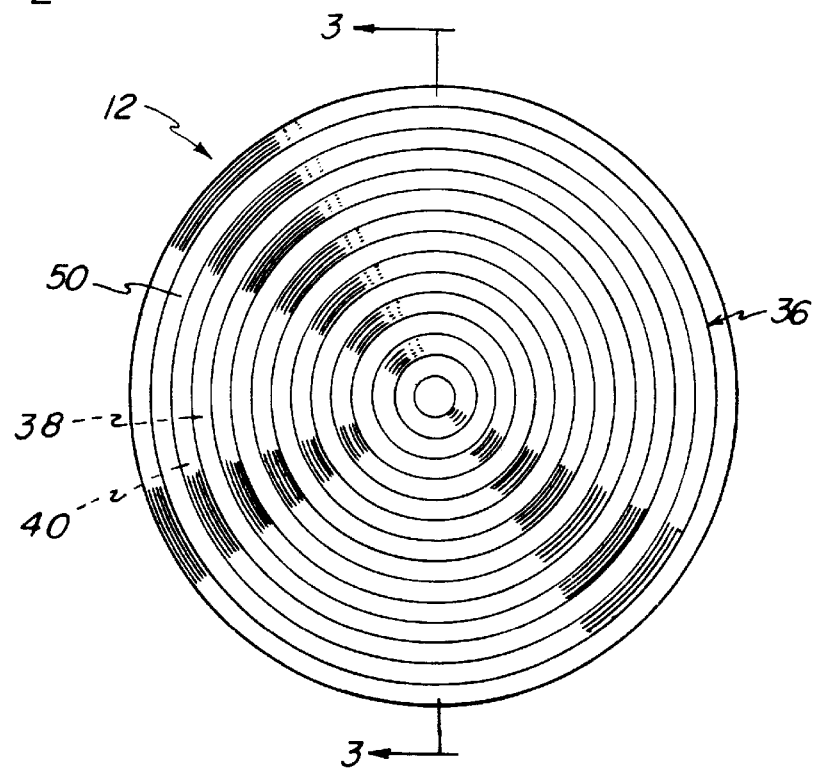
FIG. 2 is a plan view of the underside or interfacial surface of a target for use in fabricating the sputter target/backing plate assembly of FIG. 1.
Figure 3:
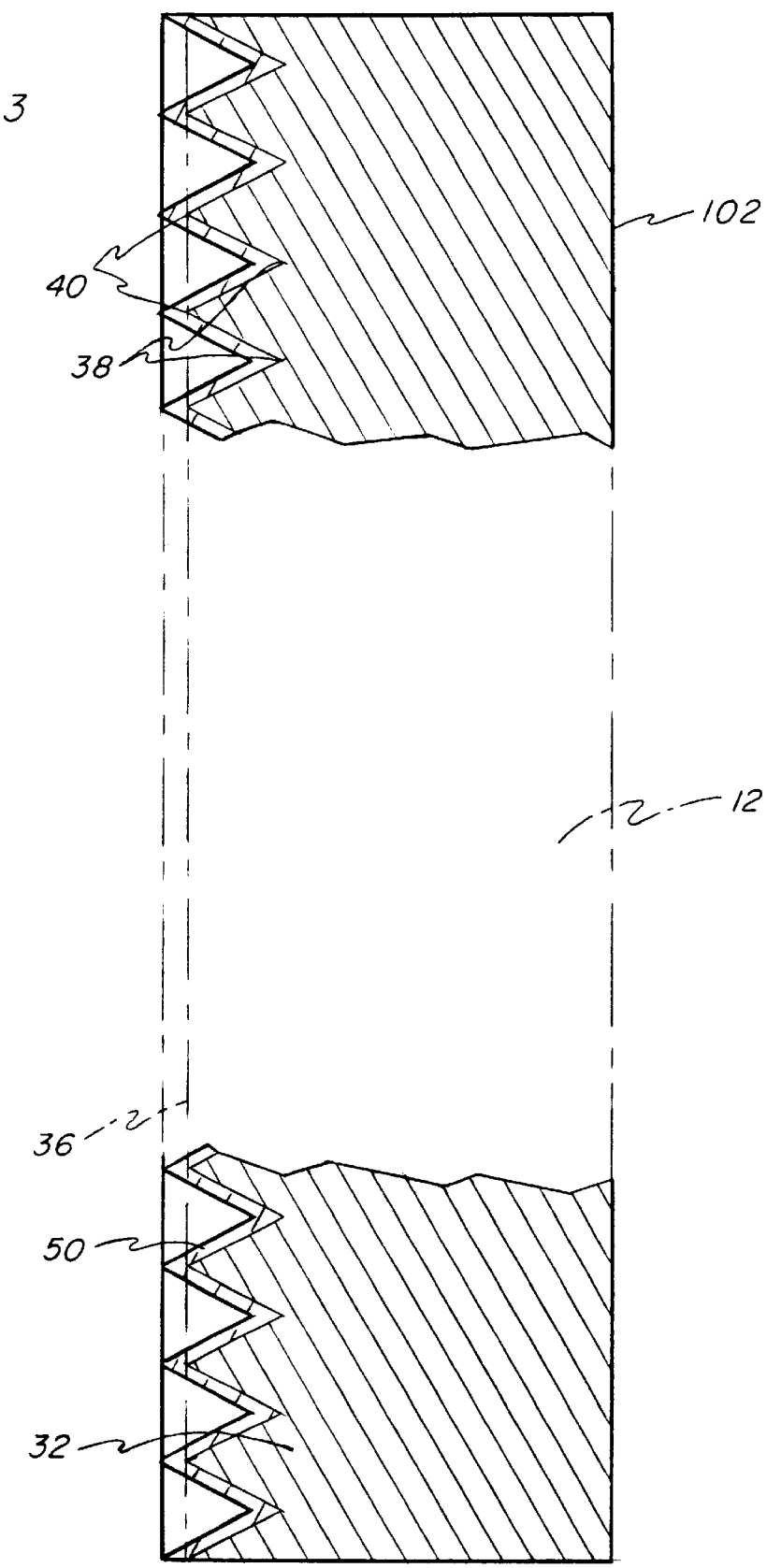
FIG. 3 is a partial side sectional view of the target, taken along the line 3—3 in FIG. 2.

FIG. 2 shows an intermediate stage in the method in which one of the intended interfacial surfaces of either the target or the backing plate is provided with a multiplicity of raised projections or salient points. Here, and as shown in FIGS. 2 and 3, the desired interfacial surface, (e.g., the underside surface of the target) is provided with a plurality of annularly shaped grooves 38 machined therein. Areas between adjacent grooves 38 are in the form of jagged V-shaped raised projections or salient points 40. As shown, the grooves 38 are concentrically arranged on the underside surface (i.e., the surface of the target adapted to matingly engage a surface of the backing plate). The grooves 38 are approximately 0.001–0.025 inch deep, preferably approximately 0.010 inch deep. As shown in FIG. 2, the grooves 38 comprise a multiplicity of unbroken, concentric circles starting with small diameter circles at the centerpoint of the surface and progressively increasing in diameter as the circles are spaced radially outwardly from the center. The skilled artisan will appreciate that the salient portions may be provided in a host of other configurations. For example, spiral grooves could be provided formed for instance by machining the shown circular surface with a continuous spiral groove starting from the end of the surface toward the center.

As best shown in FIG. 3, the grooved interfacial surface 36 of the target is then covered by an interlayer 50 of metallic nickel, or nickel alloy, having a substantially uniform thickness, preferably approximately 10–30 μm. The interlayer 50 is preferably deposited by conventional methods such as electroplating, sputtering or electroless plating, or application of a foil layer between the target and backing plates.

Figure 4:
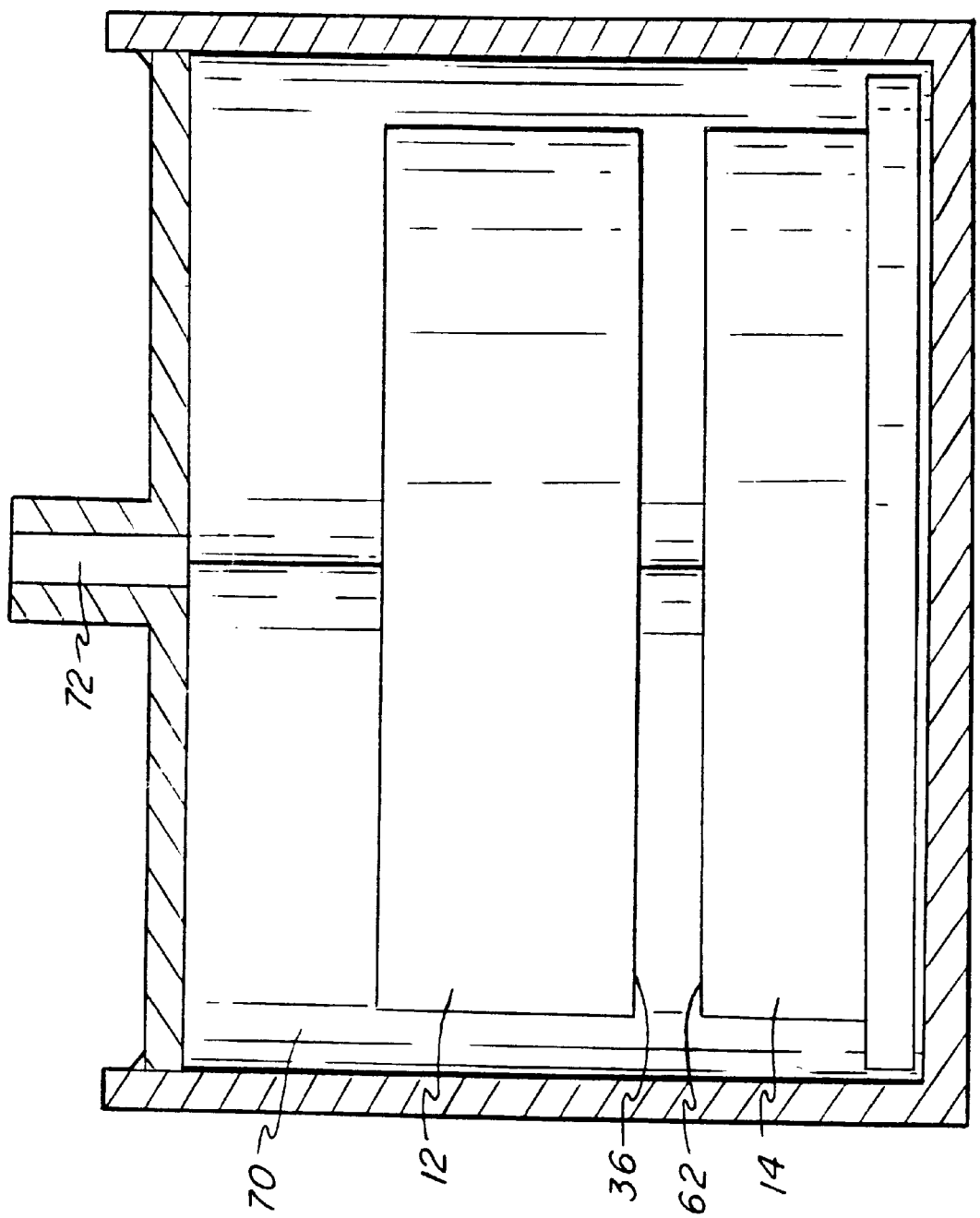
FIG. 4 is a schematic drawing showing the target/backing plate positioned in a container for diffusion bonding.

Then, as best shown in FIG. 4, the target 12 and backing plate 14, composed of aluminum, aluminum alloy or an aluminum matrix composite material are placed in a HIP canister or the like in order to bond the underside surface 36 of the target to the top or mating surface 62 of the backing plate. The underside surface 36 of the target is superposed on top of the mating surface 62 of the backing plate 14 such that the nickel interlayer 50 faces the mating surface 62 of the backing plate. Then the sputter target 12 and the backing plate 14 are heated and pressed together, thereby deforming both the first and second mating surfaces 36, 62 and disrupting any oxide or other layers on the mating surfaces 36, 62 which might interfere with formation of a strong diffusion bond.

The target 12 and the backing plate 14 are heated either prior to or concurrently with the pressing step. In accordance with solid state bonding methods, these temperatures will be chosen so as to be just below the melting point of the lower melting component of the sputter target/backing plate assembly. A controlled atmosphere such as a vacuum or inert atmosphere may be used but is not mandatory.

One preferred method for forming the desired diffusion bond is hot isostatic pressing. According to this technique, the target 12 and the backing plate 14 are placed in a metal container such as the container 70 shown in FIG. 4. The container 70 is evacuated through a tap 72 and hermetically sealed. The target 12 and the backing plate 14 are then heated and subjected to equal pressure from all sides. The pressure is typically transmitted by a pressurizing inert gas, usually argon. Hot isostatic pressing methods are described in more detail in Wickersham et al. U.S. Pat. No. 5,234,487 and the aforementioned Mueller et al. U.S. Pat. No. 5,230,459, the disclosures of which are incorporated by reference.

Another preferred method for forming the diffusion bond is vacuum hot pressing, in which the preheated target 12 and backing plate 14 combination is placed in a vacuum chamber and then pressed to promote bonding.

The pressure applied during the bonding operation may vary over a wide range. The pressure and time required are controlled so that a strong bond is formed. Of primary importance is the fact that the two mating surfaces 36, 62 be forced to conform to each other to form a continuous interface between the sputter target portion 12 (FIG. 1) and the backing plate portion 14 (FIG. 1) in the finished assembly 10 (FIG. 1).

In accordance with the presently preferred method, a high purity cylindrical copper sputter target is diffusion bonded to an aluminum alloy backing plate to form a sputter target/backing plate assembly. Concentric circular grooves having a depth of 0.010 inch (0.25 μm) are machined into a planar surface of the sputter target and an interlayer of metallic nickel having a thickness of 10–30 μm is deposited over that surface by electroplating. The sputter target and the backing plate are hot isostatic pressed for about three hours at a temperature of about 450–500° C. and a pressure of 15 ksi ($1.0 \times 10^8$ N/m$^2$). Bond strengths of as high as 5.5 ksi ($3.8 \times 10^7$ N/m$^2$) to 13.5 ksi have been achieved using this method.

While the sputter target 12 shown in the figures is circular in cross-section, the invention is equally applicable to the fabrication of sputter target/backing plate assemblies from sputter targets having rectangular or other cross-sectional shapes. Likewise, while the sputtering surface 34 (FIG. 3) of the sputter target 12 is. shown as planar, the technique is equally applicable to forming sputter target/backing plate assemblies having sputter targets of different contours. One example of a sputter target/backing plate assembly structure to which the method of the present invention may be applied is shown in FIGS. 4 and 5 of the aforementioned Mueller et al. U.S. Pat. No. 5,230,459.

While the invention is not limited to the use of concentric circular grooves such as those shown at 38 in FIGS. 2 and 3 and other patterns of roughening may be used, the use of concentric grooves forming closed loops of figures is preferred because any oxygen trapped in the metal surface will be impeded from migrating out of the surface during the sputtering operation. Such migration might contaminate the sputtering chamber and could lead to the formation of impurities on the sputter-coated surface. The use of concentric circular grooves, such as the grooves 38 shown in FIGS. 2 and 3, are especially preferred in that they are relatively easy to machine as compared to more complicated curves or figures. One alternative that may be mentioned is a spiral groove machined as a continuous groove from an outer perimeter inwardly.

One important feature of the invention is the nickel interlayer 50 deposited over the grooved or roughened surface of either the sputter target 12 or the backing plate 14. Preferably, this nickel interlayer 50 has a sufficient thickness that the target material and the backing plate material each form independent metallurgical bonds with the deposited nickel during the diffusion bonding process and that the target material/backing plate do not form any substantially amounts of intermetallic therebetween.

The method of the present invention promotes the formation of high strength diffusion bonds without the need for extensive cleaning of the mating surfaces 36, 62 of the sputter target 12 and the backing plate 14 prior to bonding. The most favorable results are obtained when one of the mating surfaces 36, 62 of the sputter target/backing plate combination is both roughened and covered with the nickel interlayer 50. In fact, the machining of concentric grooves promotes the adhesion of the nickel interlayer 50 to the desired mating surface. Similar bond strengths have not been obtained from diffusion bonding processes in which a nickel interlayer has been formed on a smooth planar sputter target surface and mated to a similarly smooth planar surface of a backing plate.

Accordingly, and returning to FIG. 1, it is apparent that in the preferred form of the invention, a copper target and aluminum backing plate assembly are diffusion bond joined along an interfacial surface 16 defined by the mating lower surface of the target and the mating upper surface of the backing plate. This interfacial area 16 may be defined as a diffusion bonded area wherein substantially no undesirable copper/aluminum intermetallic compounds are disposed. This is in contrast with prior art efforts in which copper and aluminum may be diffusion bonded. In those prior art efforts, the undesirable copper/aluminum intermetallic is formed. This is a brittle intermetallic and severely impairs the bond strength along the interfacial area.

While the method described herein and the sputter target/backing plate assemblies produced in accordance with the method constitute preferred embodiments of the invention, it is to be understood that the invention is not limited to these precise methods and sputter target/backing plate assembly structures, and that changes may be made in either without departing from the scope of the invention, which is defined in the appended claims. It is also to be kept in mind that reference to a metal or metal component herein also includes reference to alloyed forms of the stated metal. For example, Ni alloys such as Ni 1% Al or Ni 1% Cr may be noted as exemplary Ni alloys that may be used to form the desired intermediate layer.

What is claimed is:

1. In the preparation of a sputter target/backing plate assembly from a sputter target having a first mating surface and a backing plate having a second mating surface, an improved method for joining said sputter target and said backing plate along said first and second mating surfaces wherein said sputter target is composed of a first metallic material and said backing plate is composed of a second metallic material selected from the group consisting of aluminum, aluminum alloy and aluminum matrix composite materials; the improvement comprising steps of:

a) forming a plurality of salient portions on at least one of said first and second mating surfaces;

b) electroplating an intermediate layer comprising nickel on at least one of said first and second mating surfaces; and c) in a single stage pressing said sputter target and said backing plate together along said first and second mating surfaces at a temperature just below a melting point of the sputter target and backing plate to form a diffusion bond thereby joining said sputter target and said backing plate.

2. The method as recited in claim 1 wherein said first metallic material is selected from the group consisting of copper, cobalt, platinum, palladium and alloys thereof.

3. The method as recited in claim 2 wherein said first metallic material is copper or alloys thereof.

4. The method as recited in claim 1 wherein said step a) includes forming a plurality of grooves in at least one of said first and second mating surfaces.

5. The method as recited in claim 1 wherein said step a) includes machining a plurality of concentric grooves in at least one of said first and second mating surfaces.

6. The method as recited in claim 1 wherein said step a) includes forming a plurality of grooves in at least one of said first and second mating surfaces, said grooves having depths of approximately 0.001–0.025 inch.

7. The method as recited in claim 1 wherein said intermediate layer consists essentially of nickel.

8. The method as recited in claim 1 wherein said step b) includes forming said intermediate layer to a thickness of approximately 10 um to 30 um.

9. In the preparation of a sputter target/backing plate assembly from a sputter target having a first mating surface and a backing plate having a second mating surface, an improved method for joining said sputter target and said backing plate along said first and second mating surfaces wherein said sputter target is composed of a first metallic material and said backing plate is composed of a second metallic material selected from the group consisting of aluminum, aluminum alloy and aluminum matrix composite materials; the improvement comprising the steps of:

a) forming a plurality of salient portions on at least one of said first and second mating surfaces;

b) sputtering an intermediate layer comprising nickel on at least one of said first and second mating surfaces; and c) in a single stage pressing said sputter target and said backing plate together along said first and second mating surfaces at a temperature just below a melting point of the sputter target and backing plate to form a diffusion bond thereby joining said sputter target and said backing plate.

10. The method as recited in claim 9 wherein said first metallic material is selected from the group consisting of copper, cobalt, platinum, palladium and alloys thereof.

11. The method as recited in claim 10 wherein said first metallic material is copper or alloys thereof.

12. The method as recited in claim 9 wherein said step a) includes forming a plurality of grooves in at least one of said first and second mating surfaces.

13. The method as recited in claim 9 wherein said step a) includes machining a plurality of concentric grooves in at least one of said first and second mating surfaces.

14. The method as recited in claim 9 wherein said step a) includes forming a plurality of grooves in at least one of said first and second mating surfaces, said grooves having depths of approximately 0.001–0.025 inch.

15. The method as recited in claim 9 wherein said intermediate layer consists essentially of nickel.

16. The method as recited in claim 9 wherein said step b) includes forming said intermediate layer to a thickness of approximately 10 um to 30 um.

17. In the preparation of a sputter target/backing plate assembly from a sputter target having a first mating surface and a backing plate having a second mating surface, an improved method for joining said sputter target and said backing plate along said first and second mating surfaces wherein said sputter target is composed of a first metallic material and said backing plate is composed of a second metallic material selected from the group consisting of aluminum, aluminum alloy and aluminum matrix composite materials; the improvement comprising the steps of:

a) forming a plurality of salient portions on at least one of said first and second mating surfaces;

b) electrolessly plating an intermediate layer comprising nickel on at least one of said first and second mating surfaces; and c) in a single stage pressing said sputter target and said backing plate together along said first and second mating surfaces at a temperature just below a melting point of the sputter target and backing plate to form a diffusion bond thereby joining said sputter target and said backing plate.

18. The method as recited in claim 17 wherein said first metallic material is selected from the group consisting of copper, cobalt, platinum, palladium and alloys thereof.

19. The method as recited in claim 18 wherein said first metallic material is copper or alloys thereof.

20. The method as recited in claim 17 wherein said step a) includes forming a plurality of grooves in at least one of said first and second mating surfaces.

21. The method as recited in claim 17 wherein said step a) includes machining a plurality of concentric grooves in at least one of said first and second mating surfaces.

22. The method as recited in claim 17 wherein said step a) includes forming a plurality of grooves in at least one of said first and second mating surfaces, said grooves having depths of approximately 0.001–0.025 inch.

23. The method as recited in claim 17 wherein said intermediate layer consists essentially of nickel.

24. The method as recited in claim 17 wherein said step b) includes forming said intermediate layer to a thickness of approximately 10 um to 30 um.

25. In the preparation of a sputter target/backing plate assembly from a sputter target defining a first mating surface and said backing plate defining a second mating surface, an improved method for joining said sputter target and said backing plate along said first and second mating surfaces wherein said sputter target is composed of palladium and said backing plate is composed of a second metallic material selected from the group consisting of aluminum, aluminum alloy and aluminum matrix composite materials; the improvement comprising the steps of:

a) forming a plurality of salient portions on one of said first and second mating surfaces;

b) depositing an intermediate layer comprising nickel on said one of said first and second mating surfaces; and c) pressing said sputter target and said backing plate together along said first and second mating surfaces to form a diffusion bond thereby joining said sputter target and said backing plate.

26. In the preparation of a sputter target/backing assembly from a sputter target defining a first mating surface and said backing plate defining a second mating surface, an improved method for joining said sputter target and said backing plate along said first and second mating surfaces wherein said sputter target is composed of platinum and said backing plate is composed of a second metallic material selected from the group consisting of aluminum, aluminum alloy and aluminum matrix composite materials; the improvement comprising the steps of:

a) forming a plurality of salient portions on one of said first and second mating surfaces;

b) depositing an intermediate layer comprising nickel on said one of said first and second mating surfaces; and c) pressing said target and said backing plate together along said first and second mating surfaces to form a diffusion bond thereby joining said sputter target and said backing plate.

\* \* \* \* \*